United States Patent
Sun et al.

(10) Patent No.: US 7,185,384 B2
(45) Date of Patent: Mar. 6, 2007

(54) WAFER CLEANING BRUSH

(75) Inventors: Yuxia Sun, Tempe, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/312,179

(22) Filed: Dec. 20, 2005

(65) Prior Publication Data

US 2006/0096049 A1 May 11, 2006

Related U.S. Application Data

(62) Division of application No. 10/230,848, filed on Aug. 29, 2002, now abandoned.

(51) Int. Cl.
 *B08B 11/00* (2006.01)
 *B08B 1/04* (2006.01)
(52) U.S. Cl. ............................................. 15/102; 15/77
(58) Field of Classification Search .................. 15/77, 15/102
See application file for complete search history.

(56) References Cited

U.S. PATENT DOCUMENTS

| | | | |
|---|---|---|---|
| 5,725,414 A * | 3/1998 | Moinpour et al. | 451/41 |
| 5,937,469 A * | 8/1999 | Culkins et al. | 15/77 |
| 6,076,217 A * | 6/2000 | Brunelli et al. | 15/77 |
| 6,120,616 A * | 9/2000 | Bahten | 134/42 |
| 6,158,075 A * | 12/2000 | Tanaka et al. | 15/102 |
| 6,423,149 B1 * | 7/2002 | Crevasse et al. | 134/6 |
| 6,475,293 B1 * | 11/2002 | Moinpour et al. | 134/6 |
| 6,502,273 B1 * | 1/2003 | Mihara et al. | 15/230.16 |
| 6,684,447 B2 * | 2/2004 | Mihara et al. | 15/230.16 |
| 2001/0022008 A1 * | 9/2001 | Dickey et al. | 15/88.3 |
| 2002/0046434 A1 * | 4/2002 | Murakami et al. | 15/77 |
| 2004/0040575 A1 * | 3/2004 | Tregub et al. | 134/6 |

* cited by examiner

*Primary Examiner*—Randall Chin
(74) *Attorney, Agent, or Firm*—Trop, Pruner & Hu, P.C.

(57) ABSTRACT

A semiconductor wafer scrubber has a brush with a nubless outer surface for cleaning the surfaces of a semiconductor wafer. The nubless brush has a body and rotates around a central axis as it contacts the wafer surface. The brush has a central section with an outer diameter less than the diameter of the end sections.

10 Claims, 2 Drawing Sheets

WAFER CLEANING BRUSH

CROSS-REFERENCE TO RELATED APPLICATIONS

This application is a divisional of U.S. patent application Ser. No. 10/230,848, filed on Aug. 29, 2002, now abandoned.

BACKGROUND

This invention relates to semiconductor wafer processing and to cleaning the surfaces of semiconductor wafers.

Semiconductor wafers are used to manufacture integrated circuits. During the manufacturing process, wafers are put through chemical mechanical polishing (CMP). In the CMP process, the wafers are mounted on rotating holders and lowered onto a pad surface rotating in the opposite direction. A slurry of silica suspended in a mild etchant, such as potassium or ammonium hydroxide, is applied to the polishing pad. The alkaline slurry chemically grows a thin layer of silicon dioxide on the wafer surface. The buffing action of the pad mechanically removes the oxide in a continuous action. High points on the wafer surface are removed until an extremely flat surface is achieved.

After the CMP process is completed, the wafer surfaces are covered in particles, referred to as a slurry residue. Some of the slurry residue may be distributed across the top and bottom surfaces of the wafer. To remove the particles and prevent the slurry redistribution, the surfaces of a wafer are cleaned. If the slurry residue is not cleaned off the wafer surfaces, there could be a loss in die yield and/or device performance.

Different post-CMP cleaning methods have been used. These include cleaning the wafers in wet stations, or scrubbing wafers with brushes and deionized water or a combination of deionized water and chemicals such as ammonia and citric acid.

Scrubbers are automated devices that are used to remove slurry residue, contaminants and other particles from the surfaces of a semiconductor wafer. Scrubbers typically include one or more rotating cylindrical brushes that contact and brush the slurry residue, particles and other contaminants from a wafer surface. Double sided scrubbers simultaneously scrub the top and bottom surfaces of a semiconductor wafer with two rotating cylindrical brushes. In a typical scrubber, each semiconductor wafer lies flat on a conveyor mechanism which moves the wafer into and between the brushes. When the wafer is being scrubbed, the conveyor mechanism, rollers and brushes support and hold the wafer horizontally. The wafer itself also may be rotated while one or both surfaces are scrubbed by the brushes. One or more rollers may engage the edge of the semiconductor wafer to rotate the wafer.

In scrubbers, the brushes that contact and clean the top and bottom surfaces of the wafer are cylindrical bodies with nubs or bristles extending and protruding outwardly from the external surface of the body. The bristles may be made from a variety of materials including poly vinyl alcohol, nylon, or polyurethane, for example. Bristles or nubs may be mounted in holes in the external surface of the body.

The bristles or nubs on brushes for cleaning surfaces of semiconductor wafers can scratch the surfaces of wafers and/or damage the surfaces on the wafers, especially near the center of the wafers. For example, scratches can irretrievably damage sensitive patterned surfaces of semiconductor wafers. Brushes in scrubbers also may not effectively remove all the slurry residue, particles and/or contaminants from the wafer surface. A wafer having slurry residue, particles or other contaminants remaining on one or both of its surfaces could result in reduced die yield from the wafer.

A brush for a scrubber is needed that will not scratch the wafer surface and will better remove slurry residue, particles and other contaminants from both surfaces. There also is a need to reduce the time for a brush in a wafer scrubber to effectively clean the slurry residue, particles and contaminants from the top and bottom surfaces of each wafer, to increase the volume and throughput of scrubbers.

DETAILED DESCRIPTION

Figure 1:
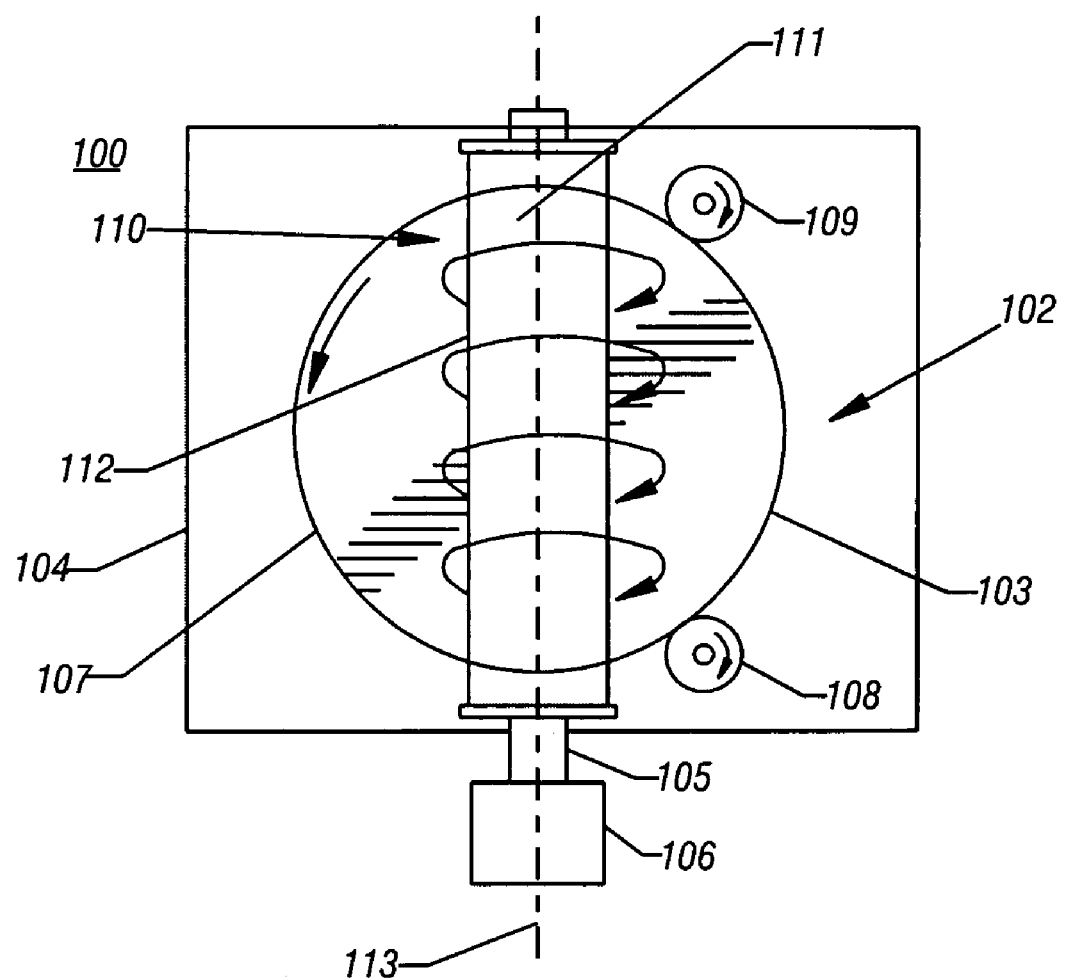
FIG. 1 is a top view of a semiconductor wafer cleaning apparatus according to one embodiment of the present invention.

FIG. 1 of the drawing illustrates a wafer scrubbing apparatus 100 for cleaning the surface of a semiconductor wafer 102. Embodiments of the invention may be used with single-sided or with double-sided wafer scrubbing devices. First surface 103 of semiconductor wafer 102 is shown being cleaned by brush 110 in a single sided wafer scrubbing apparatus. The present invention also includes a double-sided wafer scrubbing apparatus having a first brush for cleaning a first side of a wafer and a second brush (not shown) for cleaning a second surface of a wafer. The wafer scrubbing apparatus 100 may include conveying mechanism 104 which transports the wafer into a position next to the brush or between a pair of brushes so that the brush may contact the surface of the wafer.

The brush has a body 111 that may be coupled to a shaft 105 and a motor 106 that rotates the brush about its longitudinal axis of rotation 113. In one embodiment, the semiconductor wafer 102 lies horizontally as the conveyor mechanism moves and positions the wafer into contact with the brush and/or between a pair of brushes. When the wafer is being scrubbed by a brush or brushes, the conveyor mechanism supports and holds the wafer horizontally. At the same time, rollers 108 and 109 may engage the edge or outer circumference 107 of the wafer and rotate the wafer.

As shown in FIG. 1, in one embodiment of the invention, brush 110 has a generally cylindrical body 111 and a nubless outer surface 112. As used herein, the term nubless means lacking nubs, bristles or protrusions extending outwardly from the outer surface. The nubless outer surface may be smooth or uneven, porous or impermeable.

In one embodiment of the invention, the nubless outer surface is a resilient or semi-resilient material such as poly vinyl acetate. In this embodiment, the softness may be between 30 g/cm$^2$ and 150 g/cm$^2$, as defined by the standard 30% compressive stress test. In one embodiment, the outer surface is poly vinyl acetate material that is cured to achieve a desired softness. The brush may be a unitary or single component surrounding the core, or the outer surface may be adhered or laminated to an internal component.

Figure 2:
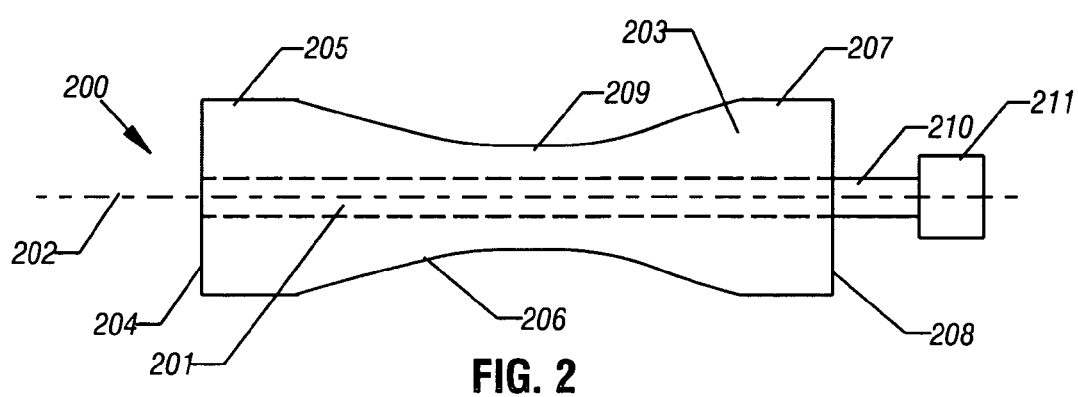
FIG. 2 is a side sectional view of a brush for cleaning semiconductor wafers according to a second embodiment of the invention.

Now referring to FIG. 2, according to one embodiment of the invention, brush 200 has a modified cylindrical shape in which the central section has a smaller diameter than the end sections. The brush has a core 201 along the axis 202 of the body 203. The brush may be coupled to shaft 210 and motor 211. The brush has first end 204, first cylindrical end section 205, central section 206, second cylindrical end section 207, and second end 208. Midpoint 209 is intermediate the central section. The length of the brush may be varied depending on size and other characteristics of semiconductor wafers to be cleaned and the structure of the scrubber.

In the embodiment of FIG. 2, the central section of the brush is tapered between the end sections and the midpoint. The outer diameters of the first and second cylindrical end sections are greater than the outer diameter of the central section. In this embodiment, the midpoint of the brush which is intermediate the central section has the smallest outer diameter. The outer surfaces of the end sections and central section of the brush are nubless, i.e., lacking nubs, bristles or protrusions extending therefrom.

Figure 3:
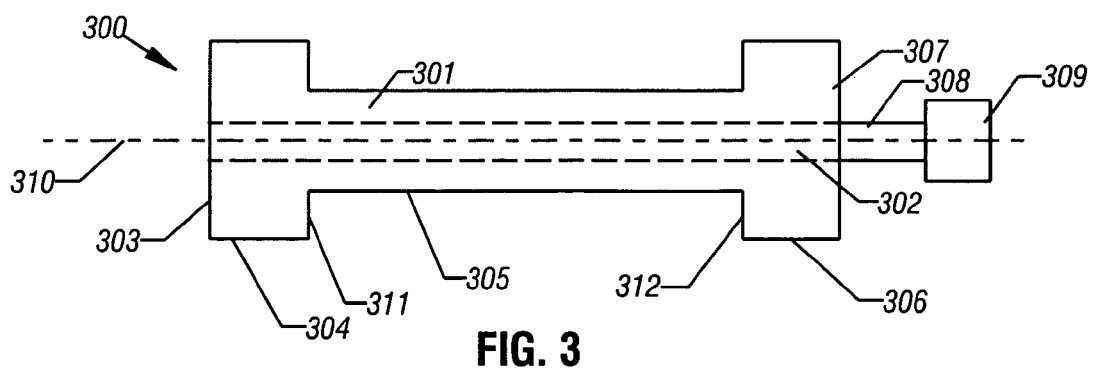
FIG. 3 is a side sectional view of a brush for cleaning semiconductor wafers according to a third embodiment of the invention.

In FIG. 3, an embodiment is shown in which brush 300 has a body 301 with a modified cylindrical shape around core 302. The body includes first end 303, first cylindrical end section 304, central section 305, second cylindrical end section 306, and second end 307. The brush may be coupled to shaft 308 and motor 309 to rotate the brush around axis 310. The body has first and second shoulders 311, 312 between the first and second cylindrical end sections and the central section. In this embodiment, the outer diameters of the first and second cylindrical end sections are greater than the outer diameter of the brush at the central section. The brush has a nubless outer surface.

In the embodiments of FIG. 2 and FIG. 3, the length of each cylindrical end section is less than one half the length of the brush, and the diameter of each cylindrical end section is greater than the diameter at the midpoint of the brush. The present invention contemplates that the length of each cylindrical end section, and the difference between the diameter of the end sections and the diameter at the midpoint, may be varied considerably. The invention may include and is not limited to brushes with cylindrical end sections having outer diameters that are greater than the outer diameter of the midpoint, and includes brushes in which the end sections have the same diameters as the midpoint or central section of the brush. The invention also contemplates brushes with tapered end sections instead of cylindrical end sections.

In the embodiments of FIGS. 1–3, the nubless outer surface of the brush has a greater area of contact with a semiconductor wafer surface than the outer surface of a brush having nubs, bristles or protrusions. In one embodiment, the nubless outer surface helps to minimize or reduce scratches to semiconductor wafer surfaces, especially near the center of wafers. Thus, the invention improves the cleaning and removal of slurry residue, particles and other contaminants from the front and back surfaces of wafers. The invention may be used to clean all layers of the wafer to remove particles, residues, and contaminants on either side or both sides of a wafer.

In addition to cleaning semiconductor wafers after CMP, certain embodiments of the invention may be used to clean slurry from wafers following shallow trench isolation/inter-layer dielectric (STI/ILD) polish, tungsten (W) polish, or copper (Cu) polish.

Although the present invention is described in conjunction with the scrubbing of a wafer, it will be appreciated that any similarly shaped, i.e., generally flat, substrate, may be processed by the methods and apparatuses of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOi) devices, two or multiple substrates bonded to each other, or substrates for processing other apparatuses and devices such as flat panel displays, multichip modules, etc.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a wafer scrubber to position and hold a semiconductor wafer; and
    a rotatable brush mounted in the wafer scrubber to contact the semiconductor wafer, the rotatable brush having a nubless outer surface, at least a portion of the nubless outer surface being generally cylindrical, wherein the brush has a softness of between 50 $g/cm^2$ and 110 $g/cm^2$; and
    wherein the rotatable brush has first and second cylindrical end sections and a central section, the first and second cylindrical end sections having outer diameters greater than the outer diameter of the central section.

2. The apparatus of claim 1 wherein the rotatable brush has a midpoint having an outer diameter less than the diameter of the first and second cylindrical end sections.

3. The apparatus of claim 1 wherein the central section of the rotatable brush is tapered.

4. The apparatus of claim 1 further comprising a shoulder between each of the first and second cylindrical end sections and the central section.

5. The apparatus of claim 1 wherein the rotatable brush has a poly vinyl acetate nubless outer surface.

6. An apparatus comprising:
    a semiconductor wafer oriented in a cleaning position; and
    first and second rotating brushes at the cleaning position to contact the semiconductor wafer, at least one of the rotating brushes having a nubless outer surface wherein the first and second rotating brushes have a softness of between 50 $g/cm^2$ and 110 $g/cm^2$; and
    wherein the rotating brush having a nubless outer surface has a first cylindrical end section, a second cylindrical end section, and a central section between the first and second cylindrical end sections, the first and second cylindrical end sections having outer diameters greater than the outer diameter of the central section.

7. The apparatus of claim 6 wherein the central section is tapered.

8. The apparatus of claim 6 further comprising a shoulder between each of the cylindrical end sections and the central section.

9. The apparatus of claim 6 further comprising at least one roller to engage the semiconductor wafer and rotate the wafer as the first and second rotating brushes contact the wafer.

10. The apparatus of claim 6 wherein the first and second rotating brushes have poly vinyl acetate outer surfaces.

* * * * *